US012713834B2

(12) United States Patent
Ko et al.

(10) Patent No.: US 12,713,834 B2
(45) Date of Patent: Aug. 18, 2026

(54) MAGNETIC TUNNEL JUNCTIONS AND METHODS OF FORMING THE SAME

(71) Applicant: Taiwan Semiconductor Manufacturing Company, Ltd., Hsinchu (TW)

(72) Inventors: Min-Yung Ko, Hsinchu City (TW); Yi-Jen Huang, Hsinchu County (TW); Yu-Jen Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 380 days.

(21) Appl. No.: 18/517,696

(22) Filed: Nov. 22, 2023

(65) Prior Publication Data

US 2025/0169369 A1 May 22, 2025

(51) Int. Cl.
*H10N 50/01* (2023.01)
*H10B 61/00* (2023.01)
*H10N 50/20* (2023.01)

(52) U.S. Cl.
CPC ............ *H10N 50/01* (2023.02); *H10B 61/22* (2023.02); *H10N 50/20* (2023.02)

(58) Field of Classification Search
CPC ................................ H10N 50/01; H10B 61/22
See application file for complete search history.

(56) References Cited

U.S. PATENT DOCUMENTS

| | | | | |
|---|---|---|---|---|
| 11,043,251 | B2 * | 6/2021 | Shen | H10N 50/01 |
| 12,154,608 | B2 * | 11/2024 | Shen | H10N 50/01 |
| 2017/0148979 | A1 * | 5/2017 | Kim | H10B 61/22 |
| 2019/0189502 | A1 * | 6/2019 | Kim | H10B 61/10 |
| 2022/0069204 | A1 * | 3/2022 | Ko | H10N 50/01 |
| 2022/0165936 | A1 * | 5/2022 | Shen | H10N 50/01 |

* cited by examiner

*Primary Examiner* — Steven M Page
(74) *Attorney, Agent, or Firm* — Harrity & Harrity, LLP

(57) ABSTRACT

A hardmask (HM), for protecting a magnetic tunnel junction (MTJ), may be formed with two portions of HM material: a taper HM portion and a vertical HM portion, separated by one or more dielectric layers. For example, a first etch process may shape the taper HM portion and the vertical HM portion such that a taller HM remains as compared with only using one HM portion. As a result, the MTJ is protected during a second etch process, which results in increased removal efficiency and lower sidewall redeposition. As a result, the taller HM reduces leakage current and increases yields. For example, the MTJ is sufficiently protected during etching such that the MTJ is less likely to experience conductive bridging and thus less likely to suffer from electrical shorts.

20 Claims, 15 Drawing Sheets

300

300

400

400

400

400

400

400

400

600

MAGNETIC TUNNEL JUNCTIONS AND METHODS OF FORMING THE SAME

BACKGROUND

Many modern-day electronic devices include electronic memory. Electronic memory may be volatile memory or non-volatile memory. Non-volatile memory is able to store data in the absence of power, whereas volatile memory is not. Magnetoresistive random-access memory and resistive random-access memory are promising candidates for next generation non-volatile memory due to relatively simple structures and compatibility with complementary metal-oxide-semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
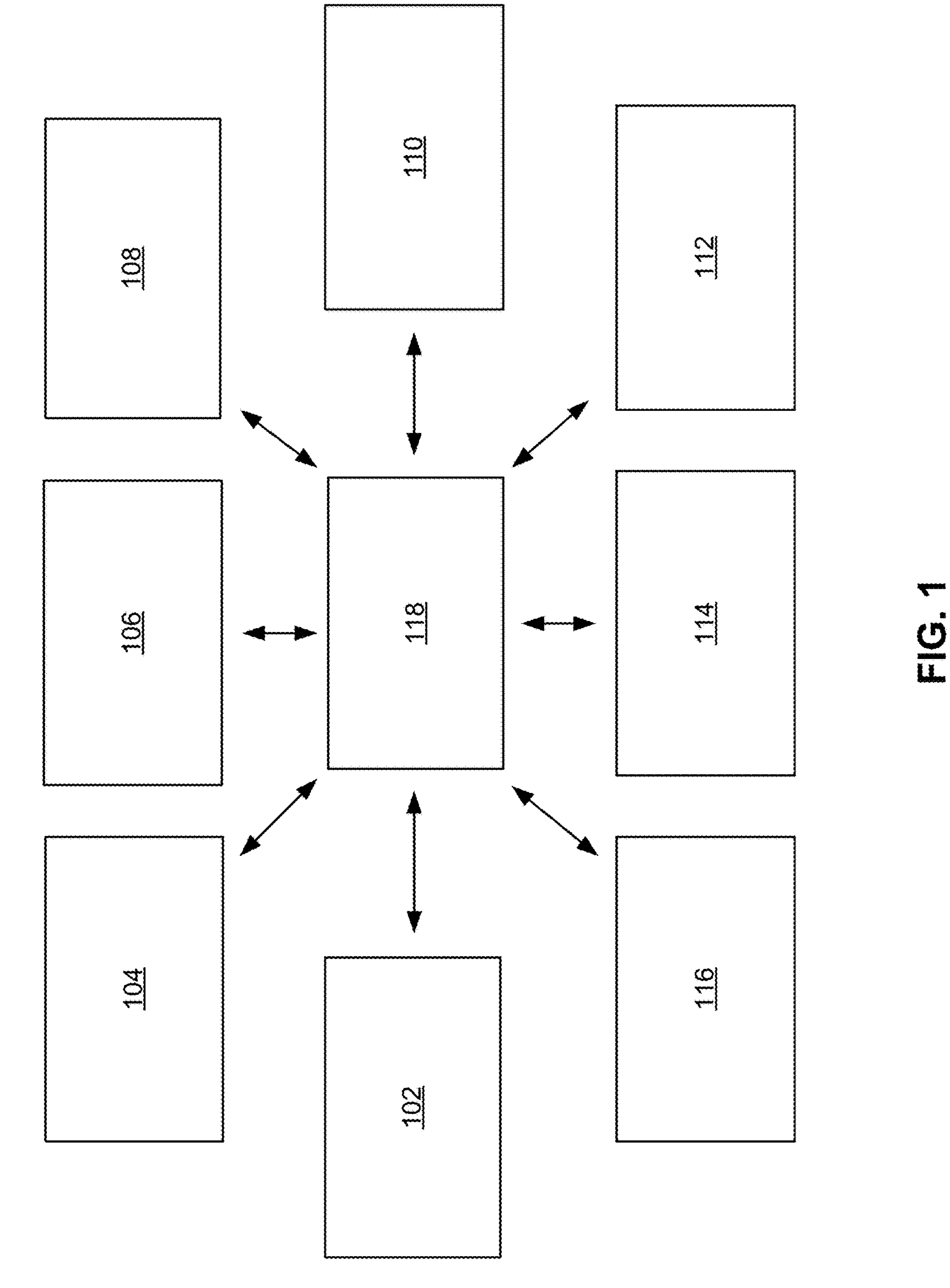
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) cell may include a magnetic tunnel junction (MTJ) vertically between a bottom electrode and a top electrode. To form an MRAM cell, a semiconductor stack may be deposited over a substrate, where the semiconductor stack includes a bottom layer, a top layer, and an MTJ material disposed between the top and bottom layers. A hardmask (HM) may be deposited over the semiconductor stack, and a photoresist (PR) mask may be formed over the HM. A first etch may be performed using the PR mask. The first etch may stop on the MTJ material and may form the top electrode from the top layer. A second etch may be performed using the HM and may form an MTJ from the MTJ material.

At least when the MTJ is formed with a small width (e.g., less than about 65 nanometers (nm) or some other suitable value), a trimming process may be used to decrease an angle between a sidewall and a bottom surface of the HM. As a result, a profile of the HM layer becomes more tapered from bottom to top. In other words, the profile of the HM decreases in width from bottom to top at a greater rate. The profile of the HM results in increased removal efficiency and lower sidewall redeposition during formation of the MTJ, which in turn may reduce leakage current and may increase yields. However, when the MTJ is formed with a smaller width (e.g., less than about 30 nm), a tapered HM may fail to provide sufficient protection during the second etch. As a result, the MTJ may experience conductive bridging between fixed and free elements of the MTJ, which results in electrical shorts.

Some implementations described herein provide techniques and apparatuses for forming an HM, for protecting an MTJ, with two portions of HM material: a taper HM portion and a vertical HM portion, separated by one or more dielectric layers. For example, a first etch process may shape the taper HM portion and the vertical HM portion such that a taller HM remains as compared with only using one HM portion. As a result, the MTJ is protected during a second etch process, which results in increased removal efficiency and lower sidewall redeposition. As a result, the taller HM reduces leakage current and increases yields. For example, the MTJ is sufficiently protected during etching such that the MTJ is less likely to experience conductive bridging and thus less likely to suffer from electrical shorts.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a photoresist removal tool 114, an annealing tool 116, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing remaining portions of a photoresist layer from a substrate after the etch tool 108 removes portions of the substrate. For example, the photoresist removal tool 114 may use a chemical stripper and/or another technique to remove a photoresist layer from a substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may pattern a hardmask into a taper profile such that a layer of polymer is formed on sidewalls of the hardmask during patterning and/or pattern an MTJ using the hardmask with the taper profile such that the hardmask is configured as a top electrode after patterning the MTJ. In another example, one or more of the semiconductor processing tools 102-116 and/or the wafer/die transport tool 118 may deposit, over MTJ material, a stack of a first hardmask material, a dielectric material, and a second hardmask material; pattern the second hardmask material into a vertical hardmask; pattern the dielectric material based on a profile of the vertical hardmask; pattern the first hardmask material into a taper hardmask; and/or pattern the MTJ material based on a profile of the taper hardmask.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
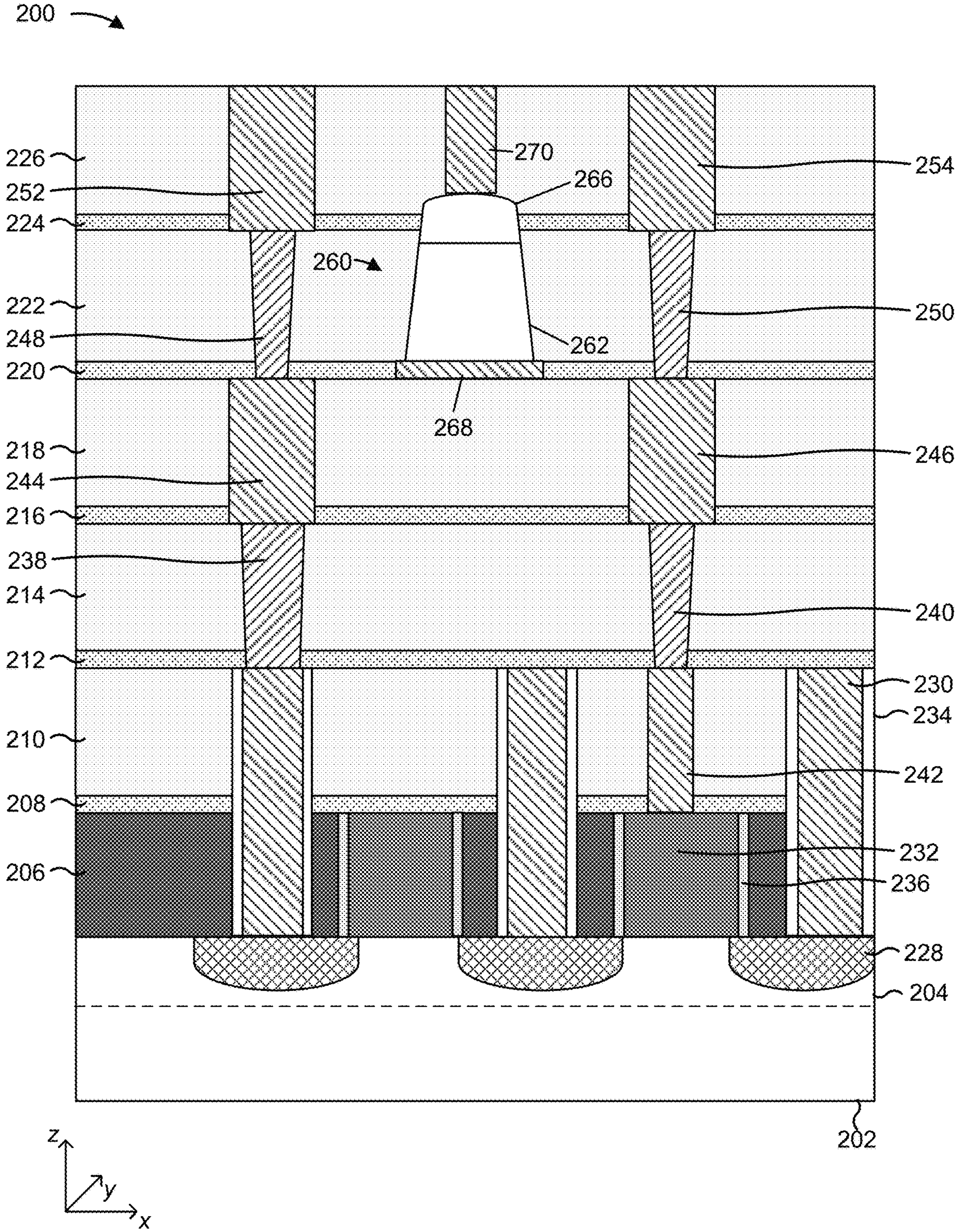
FIG. 2 is a diagram of an example semiconductor structure described herein.

FIG. 2 is a diagram of a portion of an example semiconductor structure 200 described herein. The semiconductor structure 200 may be included in a semiconductor device, such as a semiconductor memory device (e.g., a static random access memory (SRAM), a dynamic random access memory (DRAM)), an image sensor device (e.g., a complementary metal oxide semiconductor (CMOS) image sensor (CIS) device), a semiconductor logic device, a processor, an input/output device, or another type of semiconductor device that includes one or more transistors.

The semiconductor structure 200 includes one or more stacked layers. As shown in FIG. 2, the example semiconductor structure 200 includes a substrate 202. The substrate 202 may include a semiconductor die substrate, a semiconductor wafer, or another type of substrate in which semiconductor devices may be formed. In some implementations, the substrate 202 is formed of silicon (Si), a material including silicon, a III-V compound semiconductor material such as gallium arsenide (GaAs), a silicon on insulator (SOI), or another type of semiconductor material that is capable of generating a charge from photons of incident light. In some implementations, the substrate 202 is formed of a doped material (e.g., a p-doped material or an n-doped material) such as a doped silicon. The substrate 202 may include a fin structure 204.

As further shown in FIG. 2, the example semiconductor structure 200 includes a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the semiconductor structure 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the semiconductor structure 200 (or the layers included therein) to be selectively etched or protected from etching to form one or more of the structures included in the semiconductor structure 200.

As further shown in FIG. 2, the semiconductor structure 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the semiconductor structure 200.

The epitaxial regions 228 are electrically connected to metal source or drain contacts 230 of the transistors included in the semiconductor structure 200. The metal source or drain contacts 230 include cobalt (Co), ruthenium (Ru), and/or another conductive or metal material. The transistors further include gates 232, which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the semiconductor structure 200 and/or electrically connect the transistors to other areas and/or components of the semiconductor structure 200. In some implementations, the interconnects electrically connect the transistors to an interconnect region of the semiconductor structure 200.

The metal source or drain contacts 230 are electrically connected to source or drain interconnects 238 (e.g., also referred as to "source/drain vias"). One or more of the gates 232 are electrically connected to gate interconnects 240 (e.g., also referred to as "gate vias"). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (e.g., also referred to as "CBs" or "MPs") to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of additional layers, each including one or more metallization plugs and/or vias. As an example, the interconnects 238 and 240 may be electrically connected to an M0 metallization plug that includes conductive structures 244 and 246. The M0 metallization plug is electrically connected to a V0 via layer that includes vias 248 and 250. The V0 via layer is electrically connected to an M1 metallization plug that includes conductive structures 252 and 254. In some implementations, the additional layers of the semiconductor structure 200 includes additional metallization plugs and/or vias that connect the semiconductor structure 200 to a package.

As further shown in FIG. 2, the semiconductor structure 200 may include one or more devices and/or structures in the interconnect region of the semiconductor structure 200. For example, the semiconductor structure 200 may include a memory cell 260 in the interconnect region of the semiconductor structure 200. As shown in FIG. 2, the memory cell 260 may be included in the dielectric layers 222 and 226 in the interconnect region of the semiconductor structure 200. Other examples may additionally or alternatively include the memory cell 260 in one or more of the dielectric layers 210, 214, and/or 218 in the interconnect region of the semiconductor structure 200.

The memory cell 260 includes a semiconductor stack with an MTJ 262 a top electrode 266, and a bottom electrode 268. The MTJ 262 may include a fixed layer and a free layer, separated by a barrier layer, that selectively allows quantum tunneling of electrons. The free and fixed layers may include a magnetic material, such as cobalt (Co), iron (Fe), boron (B), or a combination thereof, and the barrier layer may include a crystalline material, such as magnesium oxide (MgO). To operate the MTJ 262, a magnetic direction associated with the free layer may be aligned in parallel with a magnetic direction associated with the fixed layer to place the MTJ 262 into an 'ON' or '1' state, in which quantum tunneling is allowed, and the MTJ 262 exhibits a lower resistance. On other hand, the magnetic direction associated with the free layer may be reversed (that is anti-parallel) relative to the magnetic direction associated with the fixed layer to place the MTJ 262 into an 'OFF or '0' state, in which quantum tunneling is disallowed, and the MTJ 262 exhibits a higher resistance.

The top electrode 266 and the bottom electrode 268 may each include one or more electrically conductive materials. Examples include metals like molybdenum (Mo), nickel (Ni), iridium (Ir) and chromium (Cr), as well as metal nitrides like titanium nitride (TiN) or tantalum nitride (TaN), among other examples.

As described in connection with FIGS. 3A-3B, the MTJ 262 may be formed using a taper HM in combination with a vertical HM. As a result, the MTJ 262 is protected from sidewall redeposition and thus exhibits less conductive bridging and thus fewer electrical shorts. Additionally, the top electrode 266 may be formed from the taper HM.

In some implementations, the bottom electrode 268 may connect (physically and/or electrically) to a bottom electrode via (also referred to as a "BEVA"). Alternatively, the bottom electrode via may be omitted, as shown in FIG. 2. Similarly, the top electrode 266 may connect (physically and/or electrically) to a top electrode via 270 (also referred to as a "TEVA"). Alternatively, the top electrode via may be omitted.

As indicated above, FIG. 2 is provided as an example. Other examples may differ from what is described with regard to FIG. 2.

Figure 3A:
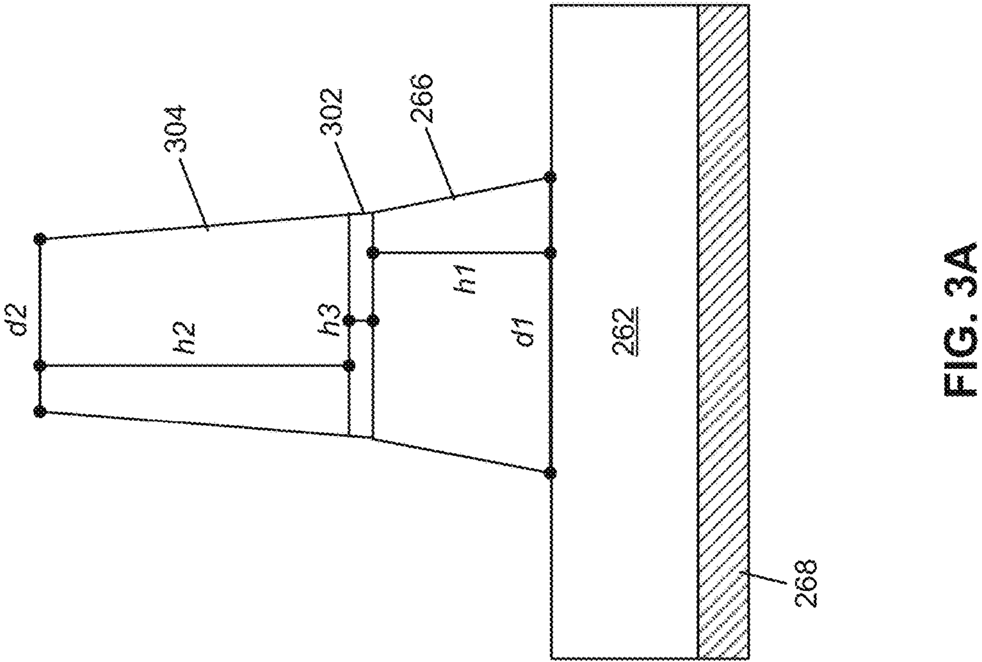
FIGS. 3A-3C are diagrams of an example semiconductor structure described herein.
Figure 3B:
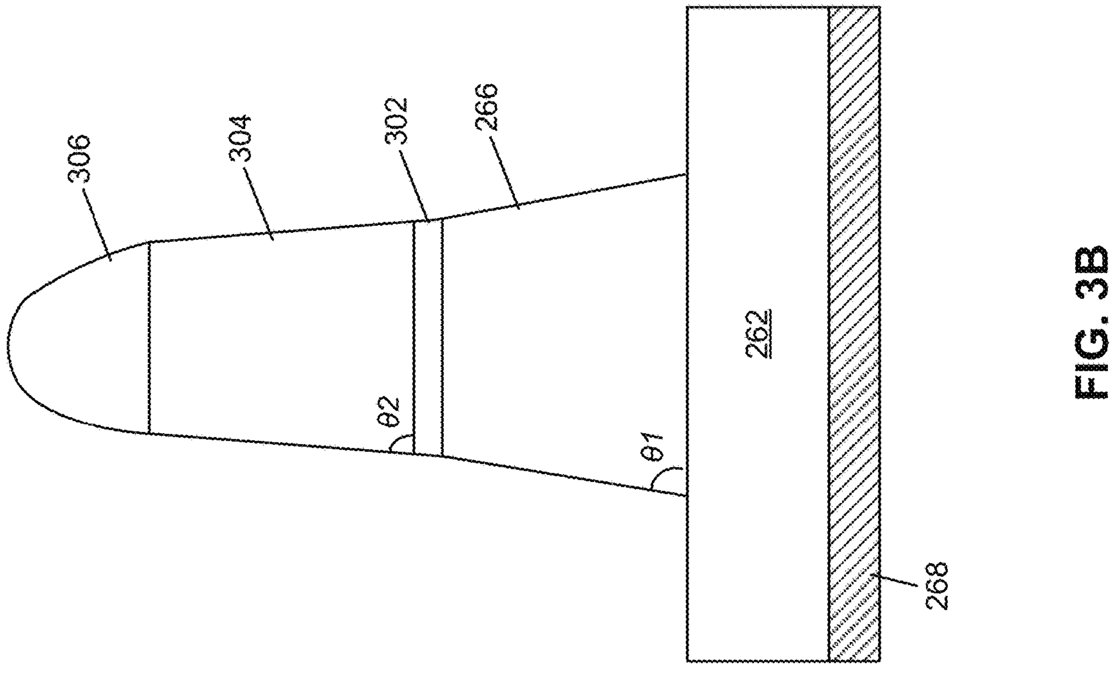
Figure 3C:
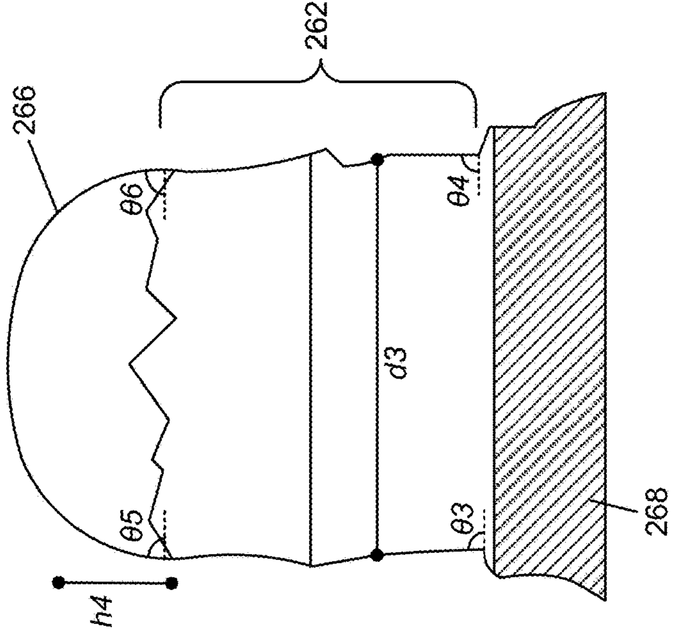

FIGS. 3A-3C are diagrams of an example semiconductor structure 300 described herein. The example semiconductor structure 300 uses an HM with a taper HM portion and a vertical HM portion to pattern an MTJ. In some implementations, the example semiconductor structure 300 illustrated in FIG. 3 may be included in a processor, a memory, or another type of electronic device.

FIG. 3A depicts an MTJ 262. The MTJ 262 may be formed in one or more dielectric layers of an interconnect region (e.g., dielectric layer 222 and dielectric layer 226 of FIG. 2) above a bottom electrode 268 (e.g., a copper metallization layer).

In order to pattern the MTJ 262 and the bottom electrode 268, an HM may be formed and patterned over the MTJ 262. The HM includes a taper HM portion (shown as HM 266 in FIG. 3A), a dielectric layer 302, and a vertical HM portion (shown as HM 304 in FIG. 3A). The HM 266 and the HM 304 may each include a metal, a metal alloy, and/or a metal nitride material (e.g., titanium nitride (TiN) and/or tantalum nitride (TaN), among other examples). The dielectric layer 302 may include silicon dioxide ($SiO_2$) and/or silicon nitride (SiN), among other examples. The dielectric layer 302 may be a single layer or a plurality of layers configured to function as a barrier between the HM 266 and the HM 304.

As further shown in FIG. 3A, the HM 266 may be patterned to have a taper profile. As used herein, "taper profile" refers to a three-dimensional profile where sidewalls form one or more angles with a bottom surface that are less than, or equal to, 85°. A width (e.g., represented by d1 in FIG. 3A) of the HM 266 on a bottom surface (e.g., a surface contacting the MTJ 262) may be in a range from approximately 27 nanometers (nm) to approximately 33 nm. Selecting a width of at least 27 nm protects the MTJ 262 during patterning (e.g., as described in connection with FIG. 4G)—a smaller width would result in damage to the MTJ 262. Selecting a width of no more than 33 nm allows for sufficient sidewall cleaning of the MTJ 262 (e.g., as described in connection with FIG. 4G)—a larger width would prevent miniaturization of the MTJ 262 below 30 nm (e.g., as described in connection with FIG. 3C). However, other values for the width of the HM 266 are within the scope of the present disclosure. Moreover, as shown in FIG. 3A, the HM 304 may be patterned to have a vertical profile. As used herein, "vertical profile" refers to a three-dimensional profile where sidewalls form one or more angles with a bottom surface that are greater than 85°. A width (e.g., represented by d2 in FIG. 3A) of the HM 304 on a top surface (e.g., a surface farthest from the MTJ 262 in FIG. 3A) may be in a range from approximately 16 nm to approximately 19 nm. Selecting a width of at least 16 nm protects the MTJ 262 during patterning (e.g., as described in connection with FIG. 4G)—a smaller width would result in damage to the MTJ 262. Selecting a width of no more than 19 nm allows for sufficient sidewall cleaning of the MTJ 262 (e.g., as described in connection with FIG. 4G)—a larger width would prevent miniaturization of the MTJ 262 below 30 nm (e.g., as described in connection with FIG. 3C). However, other values for the width of the HM 304 are within the scope of the present disclosure.

As further shown in FIG. 3A, the HM 266 may have a height (e.g., represented by h1 in FIG. 3A) in a range from approximately 200 Ångströms (Å) to approximately 400 Å. Selecting a height of at least 200 Å allows for sufficient HM material 266 remaining after patterning (e.g., as described in connection with FIG. 4G) to function as a top electrode—a smaller height would result in too small of a process read window for the MTJ 262. Selecting a height of no more than 400 Å allows for the HM 266 to be miniaturized during patterning (e.g., as described in connection with FIG. 4G)—a larger height would prevent miniaturization of the top electrode (e.g., as described in connection with FIG. 3C). However, other values for the height of the HM 266 are within the scope of the present disclosure. Similarly, as shown in FIG. 3A, the HM 304 may have a height (e.g., represented by h2 in FIG. 3A) in a range from approximately 200 Å to approximately 400 Å. Selecting a height of at least 200 Å allows for sufficient HM material 304 to pattern the HM 266 (e.g., as described in connection with FIG. 4F)—a smaller height would result in over-etching of the HM 266. Selecting a height of no more than 400 Å allows for the HM 304 to be removed during patterning of the MTJ 262 (e.g., as described in connection with FIG. 4G)—a larger height would leave the HM 304 (and the dielectric layer 302) remaining, which would increase resistance in writing to, and reading from, the MTJ 262. However, other values for the height of the HM 304 are within the scope of the present disclosure.

As further shown in FIG. 3A, the dielectric layer 302 may have a height (e.g., represented by h3 in FIG. 3A) in a range from approximately 40 Å to approximately 60 Å. Selecting a height of at least 40 Å allows for the dielectric layer 302 to function as an ESL during patterning of the HM 304 (e.g., as described in connection with FIG. 4D)—a smaller height would result in etching into the HM 266, which would disrupt the taper profile of the HM 266. Selecting a height of no more than 60 Å allows for the dielectric layer 302 to be etched (e.g., as described in connection with FIG. 4E) without damage to the HM 266—a larger height would require a longer etching cycle that would disrupt the taper profile of the HM 266. However, other values for the height of the dielectric layer 302 are within the scope of the present disclosure.

FIG. 3B is similar to FIG. 3A but shows a masking layer 306 over the HM 304. The masking layer 306 may include an oxide material, such as a tetraethyl orthosilicate (TEOS) oxide, among other examples. The masking layer 306 may protect the HM 304 during patterning of the HM 304, the dielectric layer 302, and the HM 266, as described in connection with FIGS. 4D, 4E, and 4F, respectively.

As further shown in FIG. 3B, the sidewalls of the HM 266 may form one or more angles (e.g., represented by $\theta_1$ in FIG. 3B) with the bottom surface that is in a range from approximately 75° to approximately 80°. Selecting an angle of at least 75° allows sufficient shoulder height of the HM 266 (e.g., as described in connection with FIG. 3C)—a smaller angle would result in insufficient shoulder height and thus too small of a process read window for the MTJ 262. Selecting an angle of no more than 80° prevents sidewall redeposition while patterning the MTJ 262 (e.g., as described in connection with FIG. 4G)—a larger angle would increase sidewall redeposition and thus increase leakage current in the MTJ 262. However, other values for the angle of the HM 266 are within the scope of the present disclosure. Similarly, the sidewalls of the HM 304 may form one or more angles (e.g., represented by $\theta_2$ in FIG. 3B) with the bottom surface that is in a range from approximately 85° to approximately 90°. Selecting an angle of at least 85° allows sufficient miniaturization of the HM 266 (e.g., as described in connection with FIG. 4F) and thus miniaturization of the MTJ 262 (e.g., as described in connection with FIG. 4G)—a smaller angle would result in over-etching of the HM 266 and/or the MTJ 262. Selecting an angle of no more than 90° prevents overhang of the HM 304 and thus allows sufficient polymer deposition on the sidewalls of the HM 266 (e.g., as described in connection with FIG. 4F)—a larger angle would result in insufficient polymer to shape the HM 266 into a taper profile. However, other values for the angle of the HM 304 are within the scope of the present disclosure.

FIG. 3C is similar to FIG. 3A but shows the HM 266 after patterning (and thus functioning as a top electrode), the MTJ 262 after patterning, and the bottom electrode 268 after patterning. Accordingly, the MTJ 262 has a width (e.g., represented by d3 in FIG. 3C) of less than 30 nm. For example, the width of the MTJ 262 may be in a range from approximately 25 nm to approximately 30 nm. Selecting a width of at least 25 nm allows for sufficient MTJ material 262 to carry current in order to distinguish between an ON state and an OFF state—a smaller width might result in ON and OFF states that are not distinguishable. Selecting a width of no more than 30 nm allows for the MTJ 262 to replace larger memory cells, particularly SRAM cells—a larger width would prevent further miniaturization of a processor using the SRAM cells. However, other values for the width of the MTJ 262 are within the scope of the present disclosure.

As further shown in FIG. 3C, the HM 266 may have a shoulder height (e.g., represented by h4 in FIG. 3C) in a range from approximately 60 Å to approximately 70 Å. As used herein, "shoulder height" may refer to an average or median height of a layer within an outer circumference of the layer, where the outer circumference includes 25% or less, out of a total surface area, that is farthest from a geometric center of the layer. Selecting a shoulder height of at least 60 Å allows for sidewall cleaning of the MTJ 262 without damage to the MTJ 262 as well as a sufficient process read window for the MTJ 262-*a* smaller shoulder height would result in damage to the MTJ 262 during sidewall cleaning. Selecting a height of no more than 70 Å allows for the HM 266 to function as the top electrode—a larger shoulder height would increase resistance in writing to, and reading from, the MTJ 262. However, other values for the shoulder height of the HM 266 are within the scope of the present disclosure.

As further shown in FIG. 3C, the MTJ 262 exhibits a vertical profile after patterning. For example, sidewalls of the MTJ 262 may form one or more angles (e.g., represented by $\theta_3$ and $\theta_4$ in FIG. 3C) with a bottom surface of the MTJ 262 that are in a range from approximately 85° to approximately 90°. Selecting an angle of at least 85° prevents damage to the MTJ 262 during sidewall cleaning—a smaller angle would result in damage to the MTJ 262. Selecting an angle of no more than 90° allows for sidewall cleaning of the MTJ 262—a larger angle would inhibit sidewall cleaning and thus increase leakage current in the MTJ 262. However, other values for the angle of the MTJ 262 are within the scope of the present disclosure. Moreover, as shown in FIG. 3C, the HM 266 still exhibits a taper profile after patterning. For example, the sidewalls of the HM 266 may form one or more angles (e.g., represented by $\theta_5$ and $\theta_6$ in FIG. 3C) with the bottom surface that is in a range from approximately 75° to approximately 80°. Selecting an angle of at least 75° prevents damage to the MTJ 262 during sidewall cleaning—a smaller angle would result in damage to the MTJ 262. Selecting an angle of no more than 80° allows for sidewall cleaning of the MTJ 262—a larger angle would inhibit sidewall cleaning and thus increase leakage current in the MTJ 262. However, other values for the angle of the HM 266 are within the scope of the present disclosure.

As indicated above, FIGS. 3A-3C are provided as an example. Other examples may differ from what is described with regard to FIGS. 3A-3C.

FIGS. 4A-4H are diagrams of an example implementation 400 described herein. Example implementation 400 may be an example process for forming the example semiconductor structure 300 by using an HM with a taper HM portion and a vertical HM portion to pattern an MTJ. The semiconductor structure formed using example implementation 400 may be included in a processor, a memory, or another type of electronic device.

Figure 4A:
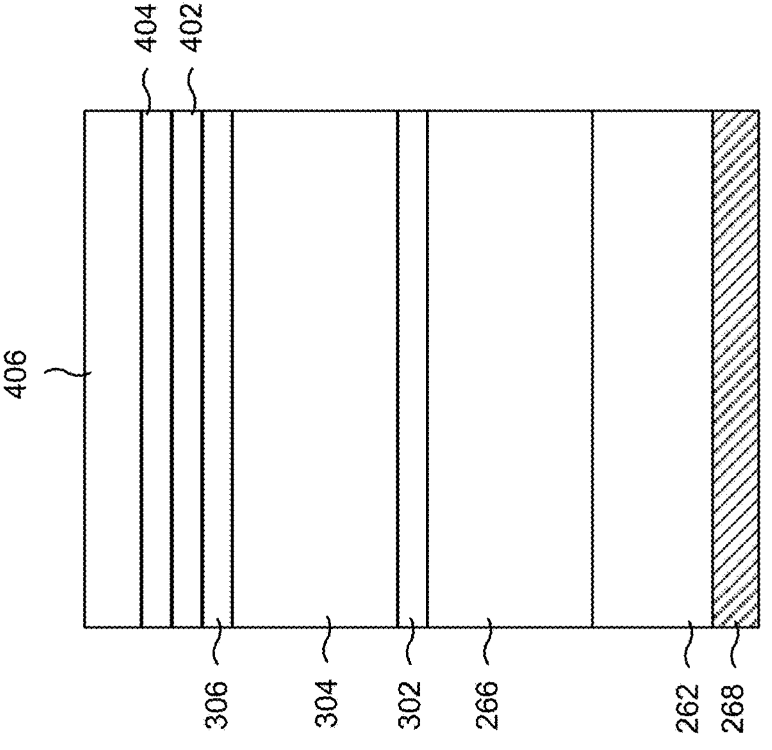
FIGS. 4A-4H are diagrams of an example implementation described herein.

As shown in FIG. 4A, the example process for forming the semiconductor structure may be performed in connection with a bottom electrode 268. In some implementations, the bottom electrode 268 is a metallization layer formed of copper.

As further shown in FIG. 4A, the example process may be performed in connection with an MTJ material 262, among other examples. For example, a deposition tool 102 may form the MTJ material 262 over and/or on the frontside surface of the bottom electrode 268. In some implementations, a deposition tool 102 forms the MTJ material 262 using a spin-coating technique, a CVD technique, a PVD technique, an ALD technique, and/or another deposition technique.

As shown in FIG. 4A, the example process may further be performed in connection with an HM 266, a dielectric layer 302, and an HM 304, among other examples. For example, a deposition tool 102 may form the HM 266, the dielectric layer 302, and the HM 304 over and/or on the frontside surface of the MTJ material 262. In some implementations, a deposition tool 102 forms the HM 266, the dielectric layer 302, and the HM 304 using a spin-coating technique, a CVD technique, a PVD technique, an ALD technique, and/or another deposition technique.

As further shown in FIG. 4A, the example process may be performed in connection with a masking layer 306, a bottom layer (BL) 402, a middle layer (ML) 404, and a photoresist (PR) mask 406, among other examples. For example, a deposition tool 102 may form the masking layer 306, the BL 402, the ML 404, and the PR mask 406 over and/or on the frontside surface of the HM 304. In some implementations, a deposition tool 102 forms the masking layer 306, the BL 402, the ML 404, and the PR mask 406 using a spin-coating technique, a CVD technique, a PVD technique, an ALD technique, and/or another deposition technique.

Figure 4B:
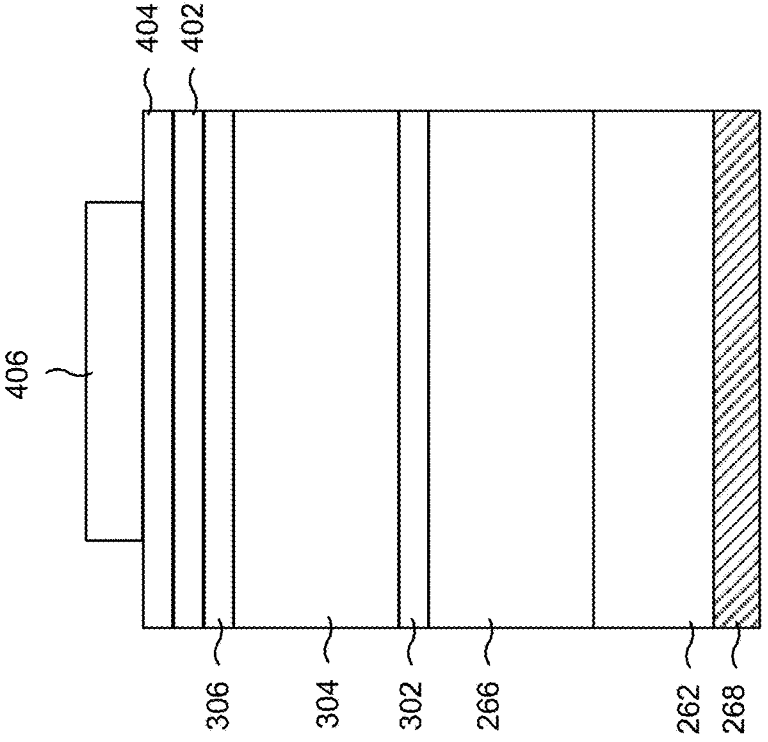

As shown in FIG. 4B, the PR mask 406 may be patterned. In some implementations, an exposure tool 104 exposes the PR mask 406 to a radiation source to form a pattern on the PR mask 406, and a developer tool 106 develops and removes portions of the PR mask 406 to expose the pattern.

Figure 4C:
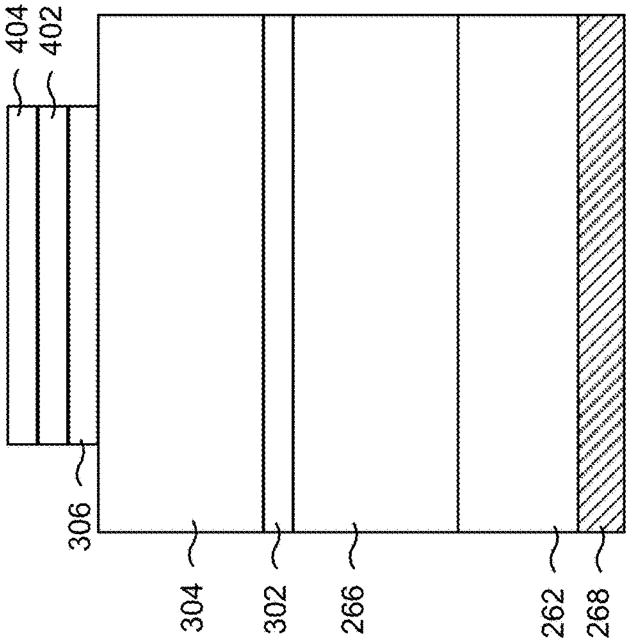

As shown in FIG. 4C, the ML 404, the BL 402, and/or the masking layer 306 may be patterned using the PR mask 406. For example, an etch tool 108 may etch portions of the ML 404, the BL 402, and/or the masking layer 306. In some implementations, an etch tool 108 uses a wet etch technique, a dry etch technique, a plasma-enhanced etch technique, and/or another type of etch technique to etch the portions of the ML 404, the BL 402, and/or the masking layer 306. As further shown in FIG. 4C, the PR mask 406 may be removed. For example, a photoresist removal tool 114 may remove remaining portions of the PR mask 406 (e.g., using a chemical stripper, a plasma asher, and/or another technique) after an etch tool 108 etches the ML 404, the BL 402, and/or the masking layer 306. In some implementations, the masking layer 306 may function as an ESL and thus may be removed using a separate etch process as compared with the ML 404 and the BL 402.

Figure 4D:
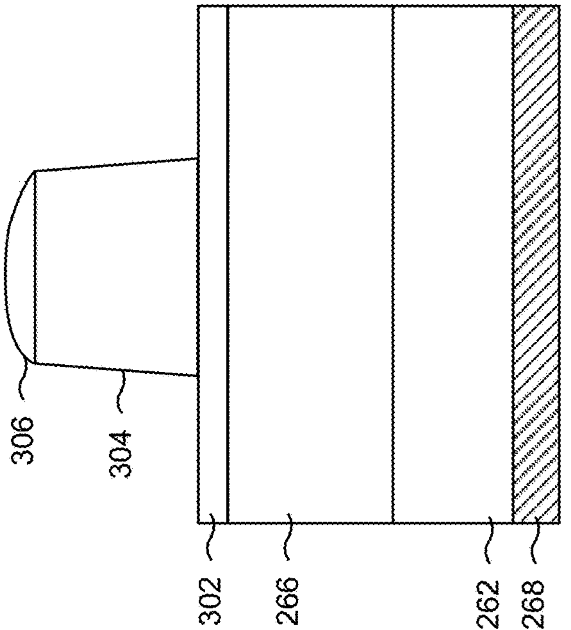

As shown in FIG. 4D, the HM 304 may be patterned (e.g., using the ML 404, the BL 402, and/or the masking layer 306). For example, an etch tool 108 may etch a portion of the HM 304. Additionally, some of the masking layer 306 may be removed as well. In some implementations, an etch tool 108 uses a chlorine-based etch process to etch the portion of the HM 304. For example, the chlorine-based etch process may result in a vertical profile for the HM 304, as described in connection with FIGS. 3A and 3B. Additionally, the dielectric layer 302 may function as an ESL and thus prevent damage to the HM 266 while patterning the HM 304.

Figure 4E:
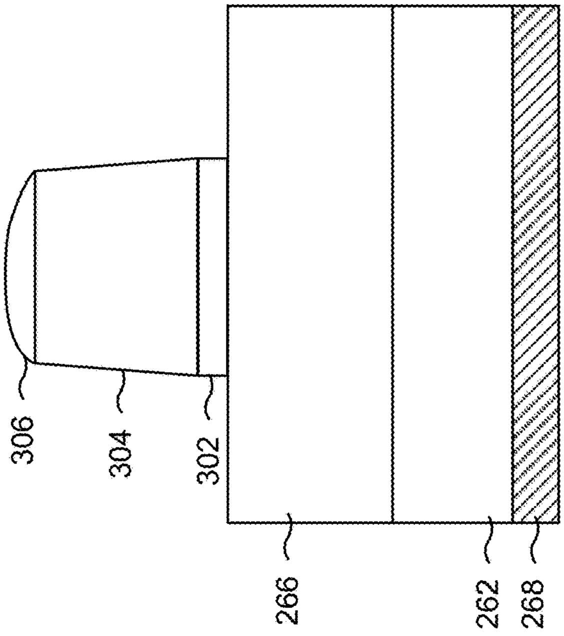

As shown in FIG. 4E, the dielectric layer 302 may be patterned (e.g., using the masking layer 306 and/or the HM 304). For example, an etch tool 108 may etch a portion of the dielectric layer 302. In some implementations, an etch tool 108 uses a fluorine-based etch process to etch the portion of the dielectric layer 302. For example, the fluorine-based etch process may remove dielectric material more efficiently than HM material such that the HM 266 is relatively undamaged while the dielectric layer 302 is patterned.

Figure 4F:
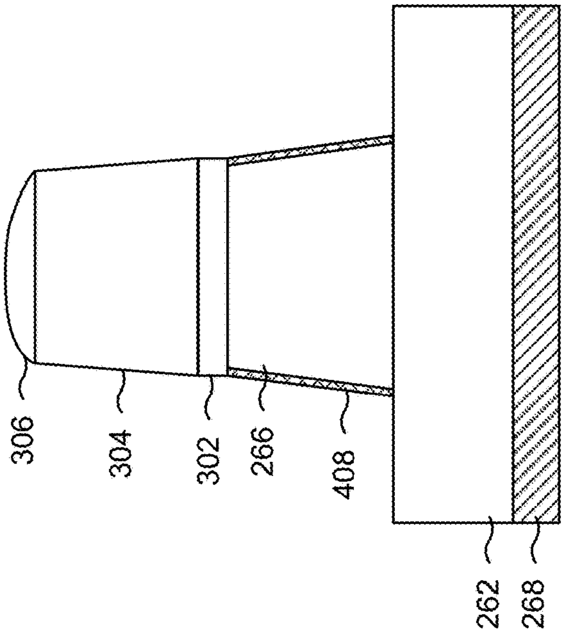

As shown in FIG. 4F, the HM 266 may be patterned (e.g., using the masking layer 306, the HM 304, and/or the dielectric layer 302). For example, an etch tool 108 may etch a portion of the HM 266. Additionally, some of the masking layer 306 may be removed as well. In some implementations, an etch tool 108 uses a chlorine-based etch process that includes a chemical that forms a byproduct (e.g., polymer 408 in FIG. 4F) on sidewalls of the HM 266 (e.g., including boron trichloride ($BCl_3$) that deposits hexagonal boron nitride (referred to as h-BN, α-BN, g-BN, or graphitic boron nitride) on sidewalls of the HM 266). The polymer 408 process may result in a taper profile for the HM 266, as described in connection with FIGS. 3A and 3B.

Figure 4G:
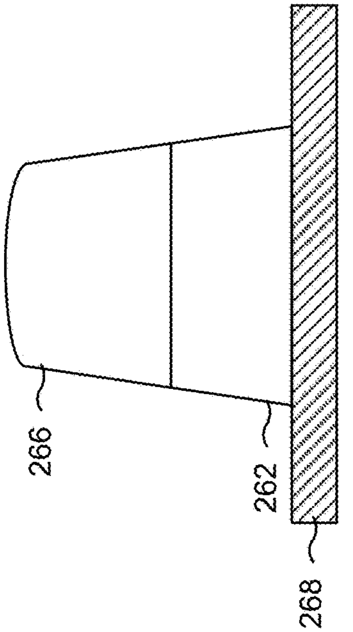

As shown in FIG. 4G, the MTJ 262 may be patterned (e.g., using the masking layer 306, the HM 304, the dielectric layer 302, and/or the HM 266). For example, an etch tool 108 may etch a portion of the MTJ 262. Additionally, the masking layer 306, the HM 304, and/or the dielectric layer 302 may be removed as well. In some implementations, an etch tool 108 uses a wet etch technique, a dry etch technique, a plasma-enhanced etch technique, and/or another type of etch technique to etch the portion of the MTJ 262. The MTJ 262 may exhibit a width less than 30 nm after patterning, as described in connection with FIG. 3C. Additionally, the HM 266 may function as a top electrode for the MTJ 262, as described in connection with FIG. 3C.

In some implementations, the polymer 408 may be removed by patterning of the MTJ 262.

Figure 4H:
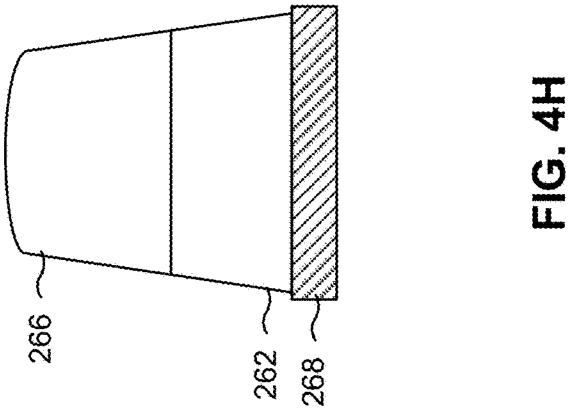

In some implementations, as shown in FIG. 4H, the bottom electrode 268 may be patterned (e.g., using the HM 266). For example, an etch tool 108 may etch a portion of the bottom electrode 268. In some implementations, an etch tool 108 uses a wet etch technique, a dry etch technique, a plasma-enhanced etch technique, and/or another type of etch technique to etch the portion of the bottom electrode 268.

Additionally, or alternatively, sidewalls of the MTJ 262 may be cleaned (e.g., using a plasma treatment). For example, the HM 266 may protect the MTJ 262 while ions that were redeposited on the sidewalls of the MTJ 262, during patterning of the MTJ 262, are cleaned off. Removing redeposited ions reduces current flow between a free layer of the MTJ 262 and a fixed layer of the MTJ 262 when magnetic directions of the layers are anti-parallel, which otherwise manifests as leakage current. As a result, performance of the MTJ 262 is improved.

As indicated above, FIGS. 4A-4H are provided as an example. Other examples may differ from what is described with regard to FIGS. 4A-4H.

Figure 5:
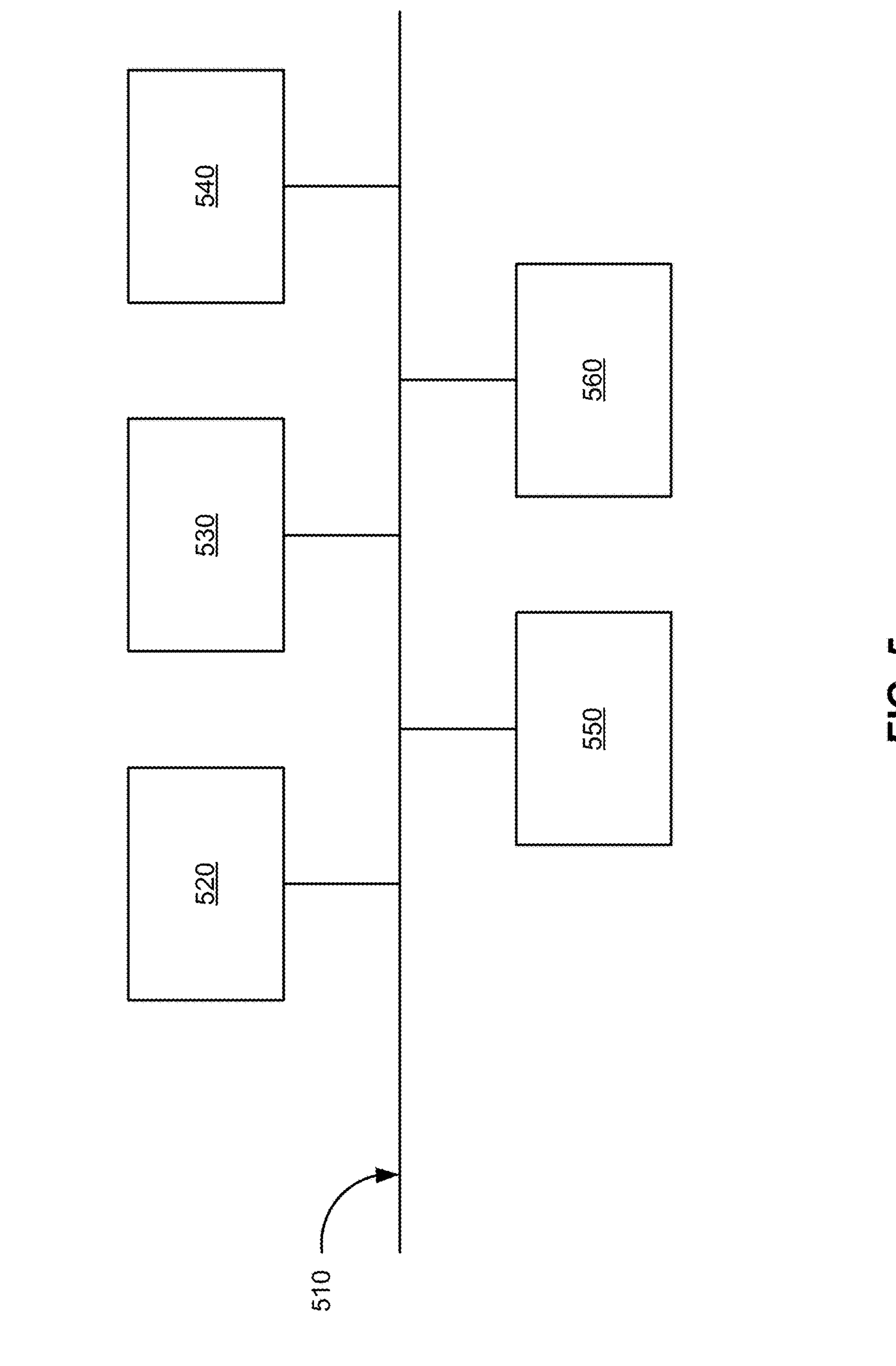
FIG. 5 is a diagram of example components of one or more devices of FIG. 1 described herein.

FIG. 5 is a diagram of example components of a device 500 described herein. In some implementations, one or more of the semiconductor processing tools 102-116 and/or the wafer/die transport tool 118 may include one or more devices 500 and/or one or more components of device 500. As shown in FIG. 5, device 500 may include a bus 510, a processor 520, a memory 530, an input component 540, an output component 550, and a communication component 560.

Bus 510 may include one or more components that enable wired and/or wireless communication among the components of device 500. Bus 510 may couple together two or more components of FIG. 5, such as via operative coupling, communicative coupling, electronic coupling, and/or electric coupling. Processor 520 may include a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware, firmware, and software. In some implementations, processor 520 may include one or more processors capable of being programmed to perform one or more operations or processes described elsewhere herein.

Memory 530 may include volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 may include one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry is used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
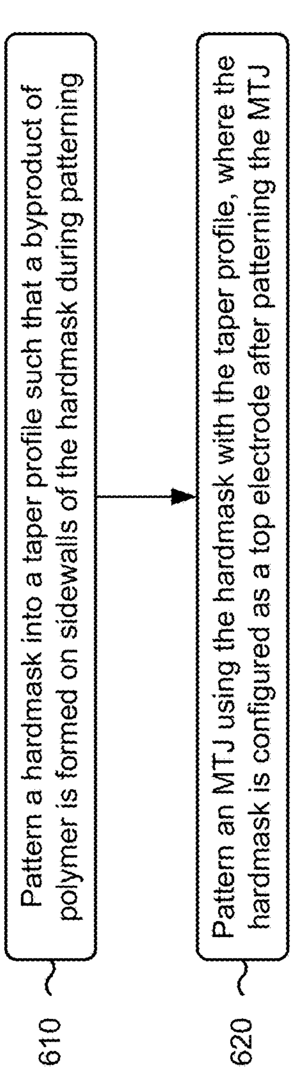
FIG. 6 is a flowchart of an example process associated with forming a magnetic tunnel junction.

FIG. 6 is a flowchart of an example process 600 associated with forming a semiconductor structure described herein. In some implementations, one or more process blocks of FIG. 6 are performed using one or more semiconductor processing tools (e.g., one or more of the semiconductor processing tools 102-116). Additionally, or alternatively, one or more process blocks of FIG. 6 may be performed using one or more components of device 500, such as processor 520, memory 530, input component 540, output component 550, and/or communication component 560.

As shown in FIG. 6, process 600 may include patterning a hardmask into a taper profile such that a byproduct of polymer is formed on sidewalls of the hardmask during patterning (block 610). For example, one or more of the semiconductor processing tools 102-116 may be used to pattern a hardmask 266 into a taper profile such that a byproduct of polymer 408 is formed on sidewalls of the hardmask 266 during patterning, as described herein.

As further shown in FIG. 6, process 600 may include patterning an MTJ using the hardmask with the taper profile, where the hardmask is configured as a top electrode after patterning the MTJ (block 620). For example, one or more of the semiconductor processing tools 102-116 may be used to pattern an MTJ 262 using the hardmask 266 with the taper profile, where the hardmask 266 is configured as a top electrode 266 after patterning the MTJ 262, as described herein.

Process 600 may include additional implementations, such as any single implementation or any combination of implementations described below and/or in connection with one or more other processes described elsewhere herein.

In a first implementation, process 600 includes performing a sidewall cleaning on the MTJ 262, where the hardmask 266 extends across an entire top surface of the MTJ 262 during the sidewall cleaning.

In a second implementation, alone or in combination with the first implementation, patterning the MTJ 262 comprises patterning a fixed layer and a free layer, each comprising a magnetic material, and patterning a barrier layer comprising a crystalline material.

In a third implementation, alone or in combination with one or more of the first and second implementations, process 600 includes patterning a bottom electrode 268 based on a profile of the MTJ 262.

In a fourth implementation, alone or in combination with one or more of the first through third implementations, patterning the MTJ 262 includes patterning the MTJ 262 to have a width in a range from approximately 25 nm to approximately 30 nm.

In a fifth implementation, alone or in combination with one or more of the first through fourth implementations, before patterning the MTJ 262, the hardmask 266 has a width in a range from approximately 27 nm to approximately 33 nm.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

In this way, an HM with two portions of HM material protects an MTJ more effectively than an HM with a single portion of HM material. For example, a first etch process may shape a taper HM portion and a vertical HM portion. As a result, the MTJ is protected during a second etch process, which results in increased removal efficiency and lower sidewall redeposition. As a result, the HM reduces leakage current and increases yields. For example, the MTJ is sufficiently protected during etching such that the MTJ is less likely to experience conductive bridging and thus less likely to suffer from electrical shorts.

As described in greater detail above, some implementations described herein provide a semiconductor structure. The semiconductor structure includes a magnetic tunnel junction (MTJ). The semiconductor structure includes a top electrode over the MTJ formed from a hardmask material, where the top electrode has a taper profile.

As described in greater detail above, some implementations described herein provide a method. The method includes depositing, over magnetic tunnel junction (MTJ) material, a stack of a first hardmask material, a dielectric material, and a second hardmask material. The method includes patterning the second hardmask material into a vertical hardmask. The method includes patterning the dielectric material based on a profile of the vertical hardmask. The method includes patterning the first hardmask material into a taper hardmask. The method includes patterning the MTJ material based on a profile of the taper hardmask.

As described in greater detail above, some implementations described herein provide a method. The method includes patterning a hardmask into a taper profile, where a byproduct of polymer is formed on sidewalls of the hardmask during patterning. The method includes patterning a magnetic tunnel junction (MTJ) using the hardmask with the taper profile, where the hardmask is configured as a top electrode after patterning the MTJ.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing, over magnetic tunnel junction (MTJ) material, a stack of a first hardmask material, a dielectric material, and a second hardmask material;
patterning the second hardmask material into a vertical hardmask;
patterning the dielectric material based on a profile of the vertical hardmask;
patterning the first hardmask material into a taper hardmask; and
patterning the MTJ material based on a profile of the taper hardmask.

2. The method of claim 1, wherein the first hardmask material is deposited to a height in a range from approximately 200 Ångströms (Å) to approximately 400 Å.

3. The method of claim 1, wherein the second hardmask material is deposited to a height in a range from approximately 200 Ångströms (Å) to approximately 400 Å.

4. The method of claim 1, wherein the dielectric material is deposited to a height in a range from approximately 40 Ångströms (Å) to approximately 60 Å.

5. The method of claim 1, wherein patterning the second hardmask material comprises:
performing a chlorine-based etch process.

6. The method of claim 1, wherein patterning the dielectric material comprises:
performing a fluorine-based etch process.

7. The method of claim 1, wherein patterning the first hardmask material comprises:
performing a chlorine-based etch process that deposits a byproduct of polymer on sidewalls of the first hardmask.

8. A method, comprising:
patterning a hardmask into a taper profile, wherein a byproduct of polymer is formed on sidewalls of the hardmask during patterning; and
patterning a magnetic tunnel junction (MTJ) using the hardmask with the taper profile, wherein the hardmask is configured as a top electrode after patterning the MTJ.

9. The method of claim 8, further comprising:
performing a sidewall cleaning on the MTJ, wherein the hardmask extends across an entire top surface of the MTJ during the sidewall cleaning.

10. The method of claim 8, wherein patterning the MTJ comprises:
patterning a fixed layer and a free layer, each comprising a magnetic material; and
patterning a barrier layer comprising a crystalline material.

11. The method of claim 8, further comprising:
patterning a bottom electrode based on a profile of the MTJ.

12. The method of claim 8, wherein patterning the MTJ comprises:
patterning the MTJ to have a width in a range from approximately 25 nanometers (nm) to approximately 30 nm.

13. A method, comprising:
depositing, on a magnetic tunnel junction (MTJ) material layer, a first hardmask layer;
depositing a dielectric layer on the first hardmask layer;
depositing a second hardmask layer on the dielectric layer;
patterning the second hardmask layer into an upper hardmask;
patterning the dielectric layer based on a profile of the upper hardmask;
patterning the first hardmask layer into a lower hardmask; and
patterning the MTJ material layer based on a profile of the lower hardmask.

14. The method of claim 13, wherein each of the first hardmask layer and the second hardmask layer comprise at least one of a metal, a metal alloy, or a metal nitride.

15. The method of claim 13, wherein one or more sidewalls of the upper hardmask form an angle with a bottom surface of the upper hardmask that is included in a range of approximately 85° to approximately 90°.

16. The method of claim 13, wherein one or more sidewalls of the lower hardmask form an angle with a bottom surface of the upper hardmask that is included in a range of approximately 75° to approximately 80°.

17. The method of claim 13, further comprising:
depositing, prior to patterning the second hardmask layer into the upper hardmask, a stacked mask structure on the second hardmask layer; and patterning the stacked mask structure into a patterned mask structure, wherein the second hardmask layer is patterned into the upper hardmask based on a profile of the patterned mask structure.

18. The method of claim 17, wherein the stacked mask structure comprises a photoresist layer on a plurality of masking layers.

19. The method of claim 13, wherein patterning the first hardmask layer into the lower hardmask comprises performing a chlorine-based etch process that forms a by-product on sidewalls of the lower hardmask, and wherein the by-product comprises hexagonal boron nitride.

20. The method of claim 13, wherein the first hardmask layer is deposited to a first height in a first range from approximately 200 Ångströms (Å) to approximately 400 Å, and wherein the second hardmask layer is deposited to a second height in a second range from approximately 200 Å to approximately 400 Å.

* * * * *